US012571822B2

(12) United States Patent
Guthrie et al.

(10) Patent No.:     US 12,571,822 B2
(45) Date of Patent:        Mar. 10, 2026

(54) CIRCUIT TOPOLOGIES FOR WIDE DYNAMIC RANGE CURRENT MEASUREMENT

(71) Applicant: Sistemi Corp., Moffat (CA)

(72) Inventors: Martin Guthrie, Moffat (CA); Sean Simmons, Waterloo (CA)

( * ) Notice:     Subject to any disclaimer, the term of this patent is extended or adjusted under 35 U.S.C. 154(b) by 259 days.

(21) Appl. No.:     18/567,465

(22) PCT Filed:     Jun. 14, 2022

(86) PCT No.:     PCT/CA2022/050945

§ 371 (c)(1),
(2) Date:     Dec. 6, 2023

(87) PCT Pub. No.: WO2022/261757

PCT Pub. Date: Dec. 22, 2022

(65)                Prior Publication Data

US 2024/0272209 A1     Aug. 15, 2024

Related U.S. Application Data

(60) Provisional application No. 63/210,406, filed on Jun. 14, 2021.

(51) Int. Cl.
   G01R 19/25          (2006.01)
(52) U.S. Cl.
   CPC ................................... G01R 19/25 (2013.01)
(58) Field of Classification Search
   CPC ... G01R 19/25; G01R 19/16552; G01R 1/203
   See application file for complete search history.

(56)                References Cited

U.S. PATENT DOCUMENTS

| | | | |
|---|---|---|---|
| 4,177,436 A | 12/1979 | Dixon et al. | |
| 10,825,626 B2 * | 11/2020 | Broadwell | H01H 47/002 |
| 11,592,467 B2 * | 2/2023 | Veil | G05B 19/0425 |
| 2011/0221424 A1 * | 9/2011 | McNamara | G01R 1/203 |
| | | | 324/126 |
| 2013/0138259 A1 * | 5/2013 | Yokoyama | G06F 17/00 |
| | | | 700/298 |

(Continued)

OTHER PUBLICATIONS

CIPO AS ISA, International Search Report and Written Opinion for PCT/CA2022/050945, Sep. 22, 2022.

(Continued)

*Primary Examiner* — Dominic E Hawkins
(74) *Attorney, Agent, or Firm* — Own Innovation Inc.; James W. Hinton; Osman Ismaili

(57)                ABSTRACT

A circuit topology for measuring current over a wide dynamic range using multiple series sense resistors and diode voltage clamping is described. A current sense network uses a diode clamping technique to reduce the voltage drop across the series network such that it can be used in a power supply circuit with minimal impact on output voltage regulation. The circuit topology allows for overlapping current measurement ranges that can be merged together to provide a wide dynamic range. The circuit topology does not dynamically switch current sense resistors (or capacitors) and avoids unintended noise injection caused by such switching, and is suitable for measuring a wide dynamic range of current in real time.

20 Claims, 16 Drawing Sheets

(56) References Cited

U.S. PATENT DOCUMENTS

| | | | |
|---|---|---|---|
| 2018/0226895 A1* | 8/2018 | Song | H02M 1/34 |
| 2020/0033422 A1 | 1/2020 | Gross | |
| 2020/0274289 A1* | 8/2020 | Li | G01R 31/52 |

OTHER PUBLICATIONS

Holenarsipur, "Performance of Current-Sense Amplifiers with Input Series Resistors", Maxim Integrated AN, Jan. 3, 2007, Maxim Integrated AN.

Regan et al., "Current Sense Circuit Collection", Linear Technology AN105, Dec. 2005, pp. 1-18, URL: https://www.analog.com/en/app-notes/an-105fa.html.

Yilan, "Diode Clipper Circuits", Medium, Nerd for Tech, URL: https://medium.com/nerd-for-tech/diode-clipper-circuits-843360522a19, Jan. 10, 2021.

Zhao et al., "High-Side Current Sensing with Wide Dynamic Range: Three Solutions", Analog Dialogue, Dec. 1, 2010, pp. 1-5, Analog Dialogue, URL: http://www.analog.com/library/analogDialogue/archives/44-12/high_side.pdf.

Zheng, "Current Sensing Circuit Concepts and Fundamentals", Microchip AN, Feb. 8, 2011, Microchip AN, URL: https://ww1.microchip.com/downloads/en/AppNotes/01332B.pdf.

* cited by examiner

CIRCUIT TOPOLOGIES FOR WIDE DYNAMIC RANGE CURRENT MEASUREMENT

TECHNICAL FIELD

The embodiments disclosed herein relate to current measurement in electrical devices, and, in particular to circuit topologies for a wide dynamic range current measurement power supply.

INTRODUCTION

There is often a desire for detailed, accurate, wide bandwidth (and/or high sample rate) real time current measurement for battery powered devices in order to confirm the hardware and software are working properly to maximize battery life.

FIG. 1A shows a system 100 powered by a battery 102, where the total battery current ($I_{TARGET}$) is to be measured. It is common practice to make the measurement with a current sense resistor, which is placed inline on the supply being measured, and measure the voltage drop across this resistor, often with a differential operational amplifier (OPAMP) and using Ohm's Law (V=I×R), to determine the current (I). Current can be integrated over time and can be compared to the battery 102 capacity to predict the device battery life.

Many embedded microcontrollers can enter low power states which reduce the current they consume, thereby increasing the device battery life. These low power states can have currents under 100 μA, even down to sub-1 μA. At the same time, these devices may have radios and/or sensors which when activated can consume 100s of milli-Amps. This range of current consumption, for example 1 μA to 500 mA is herein referred to as the "dynamic range of current" for the device being measured.

In addition to the dynamic range of current, the time the system remains in any of the high current consumption states is minimized to increase battery life. For example, a battery powered device may transmit for several milliseconds or read a sensor for several 10s of microseconds (high current states), and then return to a "standby" or "sleep" state. The measurement system samples the current fast enough in order to capture these state changes. This large dynamic range and the high sampling rate causes measurement challenges to overcome.

Referring to FIG. 1B, a further problem in current measurements is the maximum voltage drop that can be tolerated by the current measurement device, referred to as the "burden voltage" ($V_{burden}$). In an internal power system 106 consider a desire to measure 10 μA of current via a series current sense resistor 108 that is between a power supply 110 and a device being measured (DUT) 112. In choosing the value of the series current sense resistor 108, one works with the burden voltage that can be tolerated. If an oscilloscope or digital ammeter 114 is being used to measure the current, a typical minimum voltage to measure is 100 mV. Thus, the current sense resistor 108 is determined via Ohm's Law to be (0.1 V/0.00001 A)=10,000 Ohms (10K).

If the current sense resistor 108 is placed at the battery 110, with a voltage ($V_{bat}$) of 4 V, the drop across the resistor at 10 μA is 100 mV, and the device 112 will see a voltage ($V_{DUT}$) of 3.9 V, thus $V_{burden}$ is 100 mV ($V_{DUT}=V_{bat}-V_{burden}$). However, if the current increases to 100 μA, the $V_{burden}$ across a current sense resistor of 10K would be 1 V (0.0001 A×10,000 Ohms), and therefore $V_{DUT}$ would be 4

V−(0.0001 A×10,000 Ohms)=3 V, which is a dead battery to the system 106. 100 μA is hardly a large draw for any device 112 with sensors or a radio.

In practice, dropping 1 V on the input voltage to the device 112 causes other problems, for example, the large drop in voltage is coupled into the internal power system 106 and appears as "noise" and can degrade performance of the system 106, for example, a radio. In addition, any battery capacity algorithm would see the low voltage as a low battery and may trigger the system 106 to enter an unwanted low power state. Typically, an acceptable input power drop would be limited to 100 mV, which would be a common drop of a typical battery 110 under load.

A solution to the burden voltage problem is to use a differential operational amplifier (OPAMP) with gain across the current sense resistor. Referring to FIG. 2A, shown therein is a typical OPAMP circuit 120 for measuring current. An analog to digital converter (ADC) 122 has been used in place of the oscilloscope/ammeter previously described. The OPAMP 124, is typical of a class of OPAMPs that are specifically designed for the purpose of measuring current sense resistors 126.

The OPAMP 124 applies gain across the current sense resistor 126 (for example, a gain of 100). Now, the current sense resistor 126 can be 100 times smaller (e.g., instead of 10K, it could be 100 Ohms). Using 100 mV, and an OPAMP gain of 100, and desire to measure 10 μA at 100 mV, the sense resistor 124 value becomes, 0.1 V=0.00001 A*100*R, where R=1000 Ohms (1K). Or in other words, the output of the OPAMP 124 would be 0.01 V/μA, and at 10 μA would be 0.1 V.

However, the maximum current the circuit 120 could measure, in keeping with the 0.1 V drop across the sense resistor 126, would be, 0.1 V=1000 Ohms×I/100, I=10 mA, which is not enough to measure WiFi transmissions, for example. A further difficulty is measuring very low currents across a small sense resistor 126. For example, consider a 0.1 Ohm current sense resistor and the desire to measure 1 μA. From Ohm's Law, the voltage across the sense resistor is 100 nV. Using an OPAMP with a gain of 100, translates to an output voltage of 10 μV. An ADC 122 with a reference of 2.5 V would have to be at least 18 effective bits to measure that signal. It is not trivial to design such a system, in particular for measuring a dynamic range of current. Furthermore, when OPAMPs 124 with high gain are used, they also amplify the noise at their inputs.

Adding OPAMP 124 gain to the sense resistor voltage measurement can extend the measurement range, but this technique ultimately has its limitations, such as the OPAMP 124 output range which is limited by its own supply voltage, and the corresponding input voltage range of the ADC 122 used to measure that voltage.

Referring to FIG. 2B, another solution to avoid the burden voltage problem is to employ a current sense resistor 130 in a feedback loop 132 of a closed loop voltage supply, like a linear regulator 134. When the sense resistor 130 is within the feedback loop 132 of the power supply, the burden voltage caused by the sense resistor 130 is compensated for by the closed loop, within the closed loop bandwidth. Adding the sense resistor 130 to an existing closed loop power supply circuit (for example a typical linear regulator IC 134) that has not been designed to accommodate that resistor 130 is likely to disrupt the stability of its closed loop function. Although the impact of the burden voltage is compensated by the closed loop, the limitation of a single sense resistor 130 for measuring a wide dynamic range of current, as previously discussed, remains, since a closed loop will not be able to compensate for "large" burden voltages (where "large" depends on the design constraints of the closed loop).

Referring to FIG. 2C, another approach to avoid the burden voltage is using a linear regulator 140 with relays or field effect transistors (FETs) 142, 144 to switch current sense resistors 146, 148 dynamically. The current sense resistors 146, 148 have different values and are switched depending on the state of the system and/or the magnitude of the current. However, such circuits inject noise into the measurement during the switching time via the FET gate-source capacitance. When such switching circuits are used within a closed loop voltage supply 140, the gain of these circuits is so high, often switching artifacts dominate the current measurement, invalidating the results. Also, it is not possible to measure the current real time profile over a wide dynamic range and switch sense resistors 142, 144 manually.

Accordingly, there is a need for novel current sensing circuits to address the above-noted problems and limitations.

SUMMARY

According to some embodiments, there is a current sense circuit comprising a current sense network. The current sense network includes a first current sense resistor having a first value, connected in series to at least a second current sense resistor having a second value greater than the first value. The first and second values are selected to maximize voltage for a given range of current flowing through the current sense resistors. The given range of current covers, at least, a 0.1 micro-Amps to ~3.2 Amps (6-7 orders of magnitude).

A first diode voltage clamp is connected in parallel with the at least second current sense resistor, to limit burden voltage across the at least second current sense resistor for the given range of current, thereby limiting a total voltage drop across the current sense network.

The current sense network may further comprise at least a third current sense resistor having a third value greater than the second value and connected in series to the second current sense resistor, and at least a second diode voltage clamp connected in parallel with the at least third current sense resistor, to limit burden voltage across the at least third current sense resistor, thereby limiting the total voltage drop of the current sense network.

The current sense circuit further comprises a closed loop regulated voltage supply connected to the current sense resistors, for regulating voltage from a power source to a load, wherein the current sense resistors are positioned ahead of the closed loop regulated voltage supply in a direction of current flow through the current sense circuit. The total voltage drop of the current sense network is limited to a maximum voltage drop sufficient for the closed loop regulated voltage supply to supply a required voltage to the load.

The current sense network may further comprise a first fixed gain differential amplifier for amplifying a first voltage drop across the first current sense resistor into a first output voltage suitable for a current measurement by an analog to digital converter, and at least a second fixed gain differential amplifier for amplifying a second voltage drop across the at least second current sense resistor into a second output voltage suitable for the current measurement by the analog to digital converter. The digital to analog converter is a multi-channel converter configured to simultaneously measure the first output voltage and the second output voltage to sample the current measurement across the current sense resistors. The first fixed gain differential amplifier and the first current sense resistor form a first measurement path for high input voltage corresponding to a low current range within the given range of current. The second fixed gain differential amplifier and the at least second sense resistor form at least a second measurement path for low input voltage corresponding to a high current range within the given range of current. An upper limit of the low current range overlaps with a lower limit of the high current range. An upper limit of the high input voltage is at least five times an upper limit of the low input voltage.

The current sense circuit may further comprise a controller configured to analyze the current measurement from the analog to digital converter and adjust a current consumption state of the load based on the current across the current sense resistors.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

A novel approach to measuring current over a wide dynamic range by combining a series current sense resistor network with a closed loop regulated voltage supply circuit is described. The integration of these two elements removes burden voltage and provides a wide dynamic range of current measurement with low noise and high fidelity.

Figure 3:
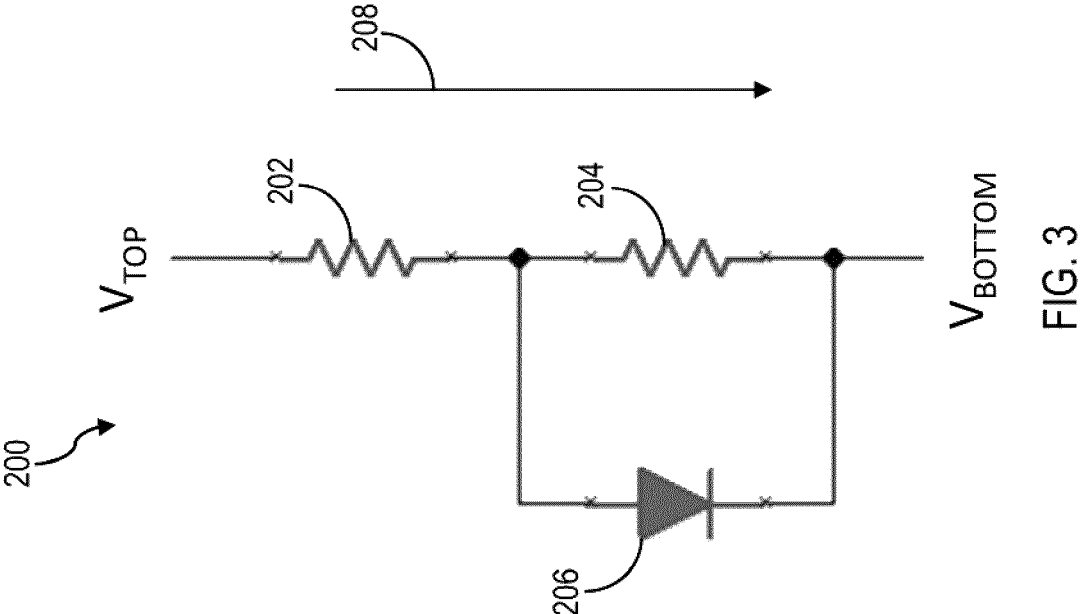
FIG. 3 is a diagram of a series current sense network, according to an embodiment.

Referring to FIG. 3, shown therein is a diagram of a series current sense resistor network 200, according to an embodiment. The current sense network 200 may be integrated into an internal power system/circuit (e.g., a power supply circuit) to measure the current therein. The current sense network 200 includes two current sense resistors 202, 204 in series. The current sense network 200 further includes OPAMPs (not shown) for measuring the voltages across the current sense resistors 202, 204.

The direction of current is from $V_{TOP}$ to $V_{BOT}$, as shown by arrow 208. The design of the current sense network 200 minimizes the total voltage drop, the burden voltage, from $V_{TOP}$ to $V_{BOT}$ while maximizing the voltage drop across the current sense resistors 202, 204. The value of the current sense resistor 204 is greater than the value of the current sense resistor 202, and the current sense resistor 204 is used to measure smaller current than the current sense resistor 202. Generally, for a given application, the maximum and minimum current to measure is known to the system/circuit designer and are inputs to define the values of the current sense resistors 202, 204 to provide overlapping ranges of current measurement.

The current sense network 200 includes a diode voltage clamp 206 on the current sense resistor 204. When the current exceeds the forward voltage of the diode voltage clamp 206, the diode voltage clamp 206 begins to conduct current, which takes away current from the current sense resistor 204. The current between the diode voltage clamp 206 and the current sense resistor 204 will balance such that the voltage across the current sense resistor 204 is limited to the forward voltage of the diode voltage clamp 206 plus some small amount.

Since the diode voltage clamp 206 limits the voltage drop across the current sense resistor 204, the value of the current sense resistor 204 can be independent of the maximum current flowing through the circuit. A larger value of the current sense resistor 204 allows for a higher voltage drop, and thus is able to measure a smaller current.

In the embodiment shown, there is no diode across the current sense resistor 202. It is assumed that the maximum current is such that the voltage drop across the current sense resistor 202 is acceptable. According to other embodiments, a further diode voltage clamp across the current sense resistor 202 could also be added and provide a similar function as the diode voltage clamp 206.

Figure 4:
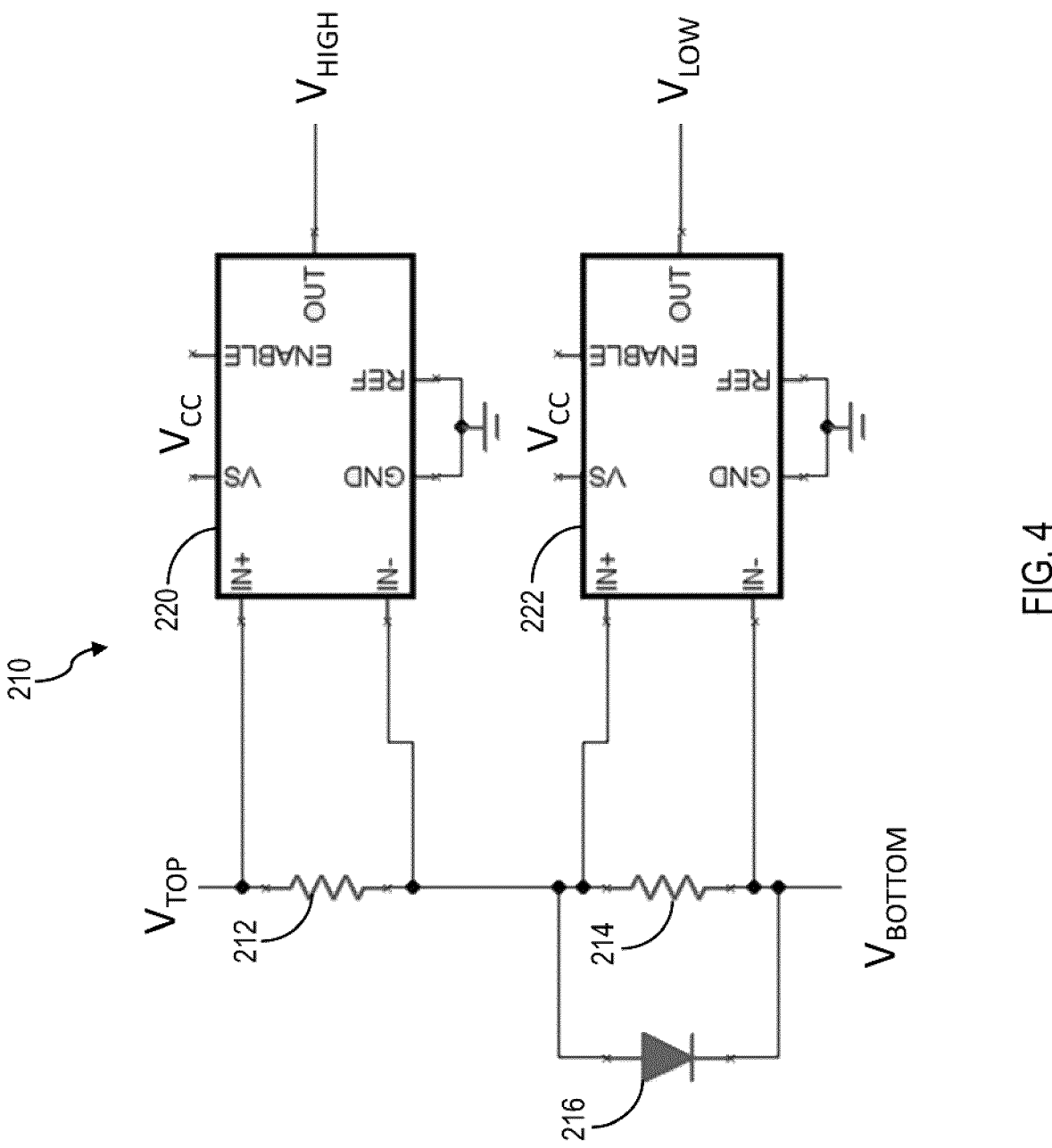
FIG. 4 is a diagram of a current sense network with OPAMP measurement, according to an embodiment.

Referring to FIG. 4, shown therein is a diagram of a current sense resistor network 210 with OPAMP measurement, according to an embodiment. The current sense network 220 is substantially similar to the current sense network 200 in FIG. 3 and includes OPAMP 220, 222 measurements of the voltages across the current sense resistors 212, 214.

The OPAMPs 220, 222 may be the INA190 from Texas Instruments®, a class of low noise instrumentation OPAMP with a fixed gain of 25, specifically configured for amplifying voltage through a current sense 212, 214. Discrete implementations of the OPAMPs 220, 222 can be used and are familiar to those skilled in the art. In general, the OPAMPs 220, 222 are configured to amplify the voltage drop across the current sense resistors 212, 214 and convert the input voltage to an output voltage ($V_{HIGH}$ and $V_{LOW}$) suitable for measurement by an analog to digital converter (ADC). It should be noted that $V_{HIGH}$ and $V_{LOW}$ are single ended signals (referred to ground), however, according to other embodiments the OPAMPs 220, 222 may be configured to create differential $V_{HIGH}$ and $V_{LOW}$. Not shown in FIG. 4 is the analog to digital conversion of $V_{HIGH}$ and $V_{LOW}$.

The gain of the OPAMPs 220, 222 and the value of the current sense resistors 212, 214 depend on the range of current to be measured, the output range of the OAPMPs 220, 222, and the input range of the ADC (not shown). There are several factors known to those skilled in the art to consider when determining these values.

The diode voltage clamp 216 forward voltage can be in the range of 0.3 V to 0.7 V, depending on the diode technology. The forward voltage is typically specified in the datasheet of candidate devices.

The OPAMPs 220, 222 output voltage maximum depends on the supply voltage ($V_{CC}$)—it cannot be more. Consider an example of $V_{CC}$=2.5 V and the OPAMPs 220, 222 gain of 25. Thus, the input differential voltage to the OPAMPs 220, 222 will be limited to 0.1 V (2.5 V/25). This maximum voltage should be below the forward voltage of the diode voltage clamp 216, so that within the measurement range of the current sense resistor 214, the diode voltage clamp 216 is not forward biased, and is not conducting significant current relative to that flowing through the current sense resistor 214. The same principle applies to the current sense resistor 212, i.e., the maximum differential voltage across the current sense resistor 212 is 0.1 V.

For a given range of current to be measured, the measurement will be split between the current sense resistors 212, 214 in an overlapping manner. For example, assuming that the total desired voltage drop across the current sense network 210 is 0.5 V, the diode voltage clamp 216 will be chosen such that its forward drop is 0.4 V. The current sense resistor 212 will have 0.1 V at maximum current. Assuming the desired current to be measured has a maximum of 1 Amp, the current sense resistor 212 is calculated as 0.1 V/1 Amp=0.1 Ohms.

The minimum value of current that the current sense resistor 212-OPAMP 220 can resolve is determined (in part) by the ADC measuring $V_{HIGH}$. This can be calculated by determining the magnitude of the least significant bit (LSB). Assuming an ADC reference voltage of 2.5 V and 16 bits, the minimum resolvable voltage is 2.5 V/(2^16−1)=~38 μV. Referencing the voltage to the input side of the OPAMP 220, with a gain of 25, is ~1.5 μV. I=V/R=1.5 μV/0.1=15 μA. However, in practice this is not achievable, given circuit noise, and noise of the OPAMP 220. Therefore, the practical minimum value will be several LSBs, assuming that measurement of 100 μA is achievable.

In order to extend the dynamic measurement range, the current sense resistor 214-OPAMP 222 current measurement path will be employed. To have an overlapping range, the maximum current for the current sense resistor 214 is set to 500 μA (5 times the minimum resolution of the current sense resistor 212-OPAMP 220 current measurement path). The maximum value of the current sense resistor 214 is then 0.1 V/500 μA=200 Ohms. Without the diode voltage clamp 216, the maximum voltage drop of the current sense resistor 214 would be V=I*R=1 Amp*200 Ohms=200 V. Generally, 200 V would not allow the circuit to work. The diode voltage clamp 216 is key to clamping the voltage across the current sense resistor 214 such that the total drop across this sensing network is 0.5 V (in this example).

Now consider the lowest current that can be measured on the current sense resistor 214-OPAMP 222 current measurement path. I=V/R, 1.5 V/200 Ohms=0.07 μA. This is significantly lower than the current sense resistor 212-OPAMP 220 current measurement path alone. Accordingly, the current sense network 210 can extend the current measurement range while keeping the total voltage drop across the circuit relatively small. It should be understood that the above exemplary values and parameters for the current sense resistors 212, 214, the diode voltage clamp 216 and the OPAMPS 220, 222 may be different according to the specific components used.

The current sense network 210 can be integrated into a power supply circuit, given that the voltage drop across the sensing circuit is small. Without a small voltage drop across the current sense network 210, load regulation of the resulting power supply would be poor. Since the current sense network 210 keeps the burden voltage within a small range, this allows a closed loop power supply design to be realized, i.e., to properly work, without having to deal with large burden voltages. Several possible power supply architectures are possible as described below.

Figure 5:
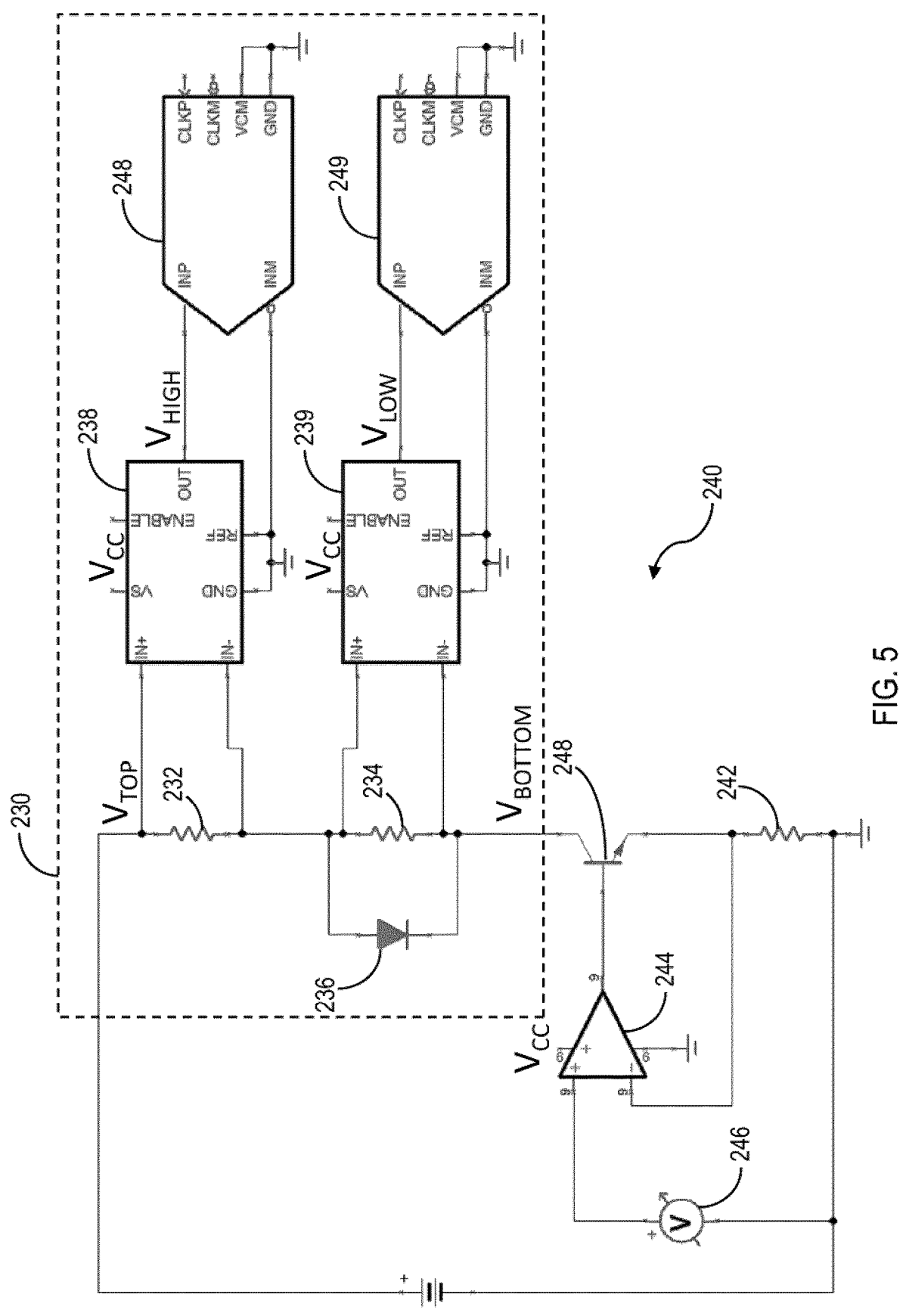
FIGS. 5-7 are diagrams of power supply circuits incorporating a current sense network, according to various embodiments.

Referring to FIG. 5, shown therein is a diagram of a power supply circuit 240 incorporating a current sense network 230, according to an embodiment. The power supply circuit 240 is an exemplary circuit for creating a "emitter-follower" power supply. For ease of illustration, feedback compensation components, decoupling capacitors and other "glue" components that would be familiar to those skilled in the art of power supply design have been omitted.

The power supply circuit 240 includes a load 242 (drawn as a resistor). The load 242 current varies with time. The load 242 may be, for example, an IoT device with a microcontroller that is entering and exiting deep sleep states, as well as turning on/off radio access and having a current profile that extends from micro-Amps to hundreds of milli-Amps. The power supply circuit 240 includes a closed loop emitter-follower power supply 244 having a reference voltage 246.

The current sense network 230 is incorporated into the power supply circuit 240 ahead of (upstream) of voltage regulation/switching components 244, 246, 248 in the power supply circuit 240. The current sense network 230 is substantially similar to the current sense network 210 in FIG. 4 and includes two current sense resistors 232, 234, a diode voltage clamp 236 on the current sense resistor 234 and OPAMPs 238, 239 to apply gain across the current sense resistors 232, 234. The current sense network 230 includes a low current measurement path via current sense resistor 234-OPAMP 239 and a high current measurement path via current sense resistor 232-OPAMP 238.

The current sense network 230 further includes analog to digital converters (ADCs) 248, 249 for measurement of $V_{HIGH}$ and $V_{LOW}$. The conversion of the analog voltages into digital would then be digitally processed to achieve various results. For example, one result would be to merge the measurement paths from the two ADCs 248, 249 to a single stream. It is noted that the $V_{HIGH}$ and $V_{LOW}$ streams are overlapping. This enables an algorithm/microcontroller to select between the measurement paths and merge them when they overlap.

Figure 6:
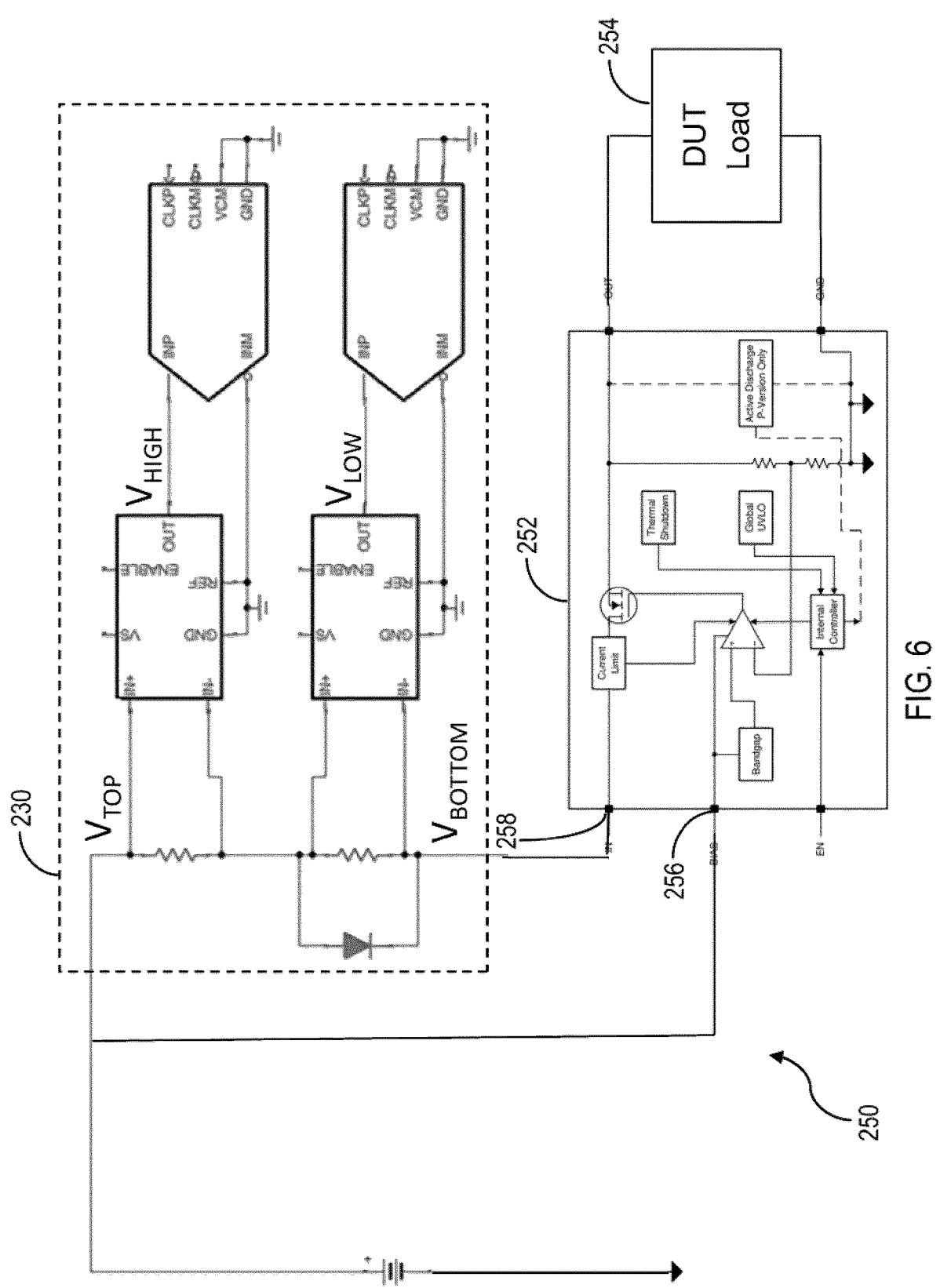

Referring to FIG. 6, shown therein is a diagram of a power supply circuit 250 having the current sense network 230 integrated with a monolithic linear regulator circuit 252, according to an embodiment. The linear regulator 252 regulates power supply to a load 254. The load 254 current varies with time. The load 254 may be an IoT device with a microcontroller that is entering and exiting deep sleep states, as well as turning on/off radio access and having a current profile that extends from micro-Amps to hundreds of milli-Amps. For ease of illustration, pass filtering components, decoupling capacitors and other "glue" components familiar to those skilled in the art of power supply design have been omitted.

The quiescent current of monolithic linear regulators can vary widely with load current and temperature and is undesirable when trying to measure very small currents. Typical designs can have sleep or standby states on the order of 1-10 μA, which is comparable to quiescent currents of low quiescent current linear regulators. Such linear regulator quiescent currents are not well characterized, making it difficult to determine from a current measurement that includes both the load (e.g., a device under test) current and the linear regulator current, how that current was split between those two current consumers.

The monolithic linear regulator 252 may be a TPS7A11 linear regulator from Texas Instruments. The monolithic linear regulator 252 architecture is specifically suited for current measurement because the internal loop control circuitry is powered from a different pin 256 than the output current pin 258. Thus, the quiescent current of the monolithic linear regulator 252 is not part of the load 254 measurement current.

Figure 7:
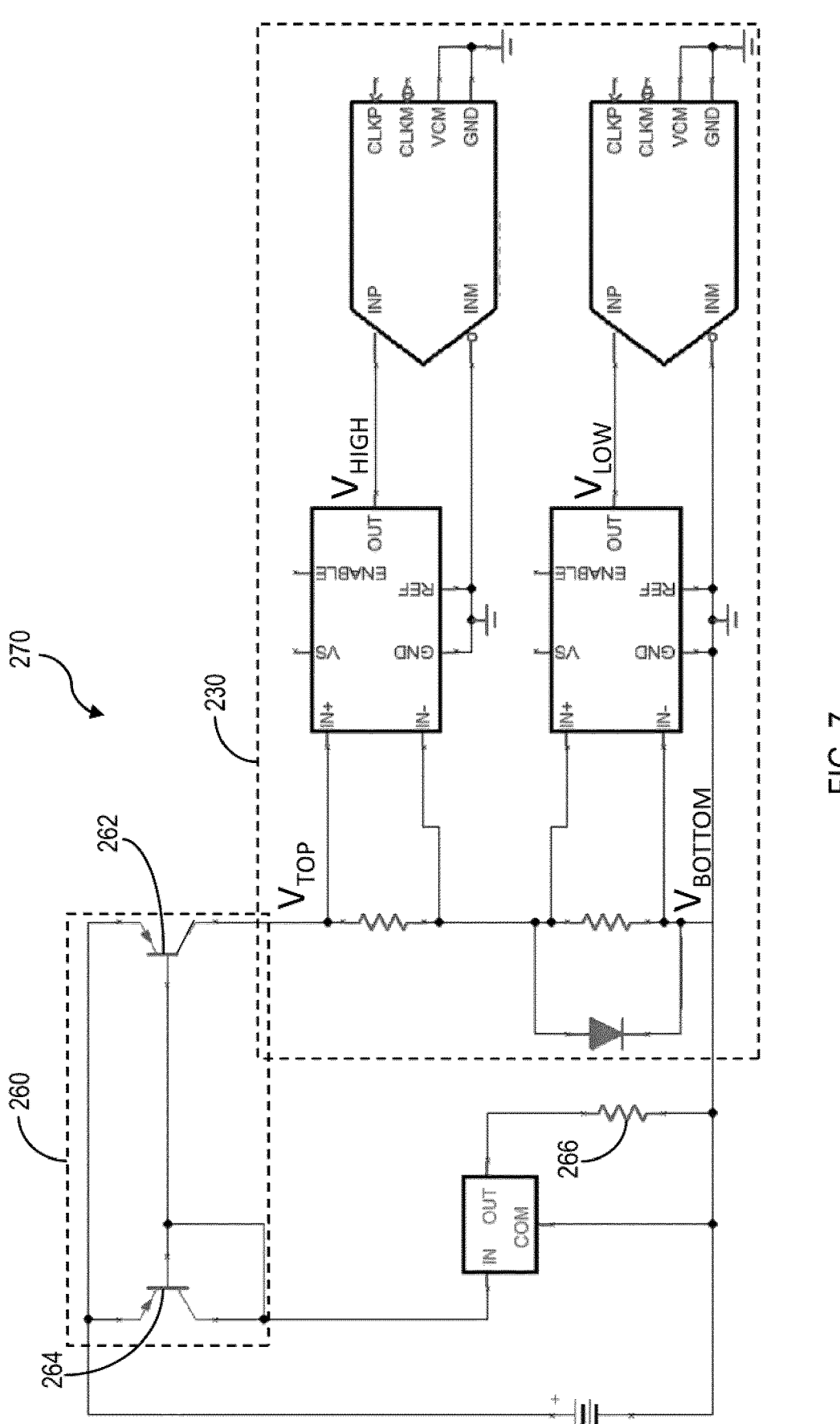

Referring to FIG. 7, shown therein is a diagram of a power supply circuit 270 having the current sense network 230 integrated with a current mirror 260, according to an embodiment. The current mirror 260 mirrors the current to a load 266 (shown as a resistor) and directs the current into the current sense network 230. The load 266 may be an IoT device with a microcontroller that is entering and exiting deep sleep states, as well as turning on/off radio access and having a current profile that extends from micro-Amps to hundreds of milli-Amps.

The advantage of the architecture in FIG. 7 is that the current mirror 260 change in voltage is even less than that of the current sense network 230. The current mirror 260 may be a simple PNP current mirror 260 made from PNP transistors 262, 264 as shown. According to other embodiments, other current mirrors familiar to those skilled in the art, for example, a cascode current mirror or Widlar current mirror may be used. The current sense network 230 can also be extended to use three (or more) sensing resistors to achieve an even wider dynamic range of current measurement.

Figure 8:
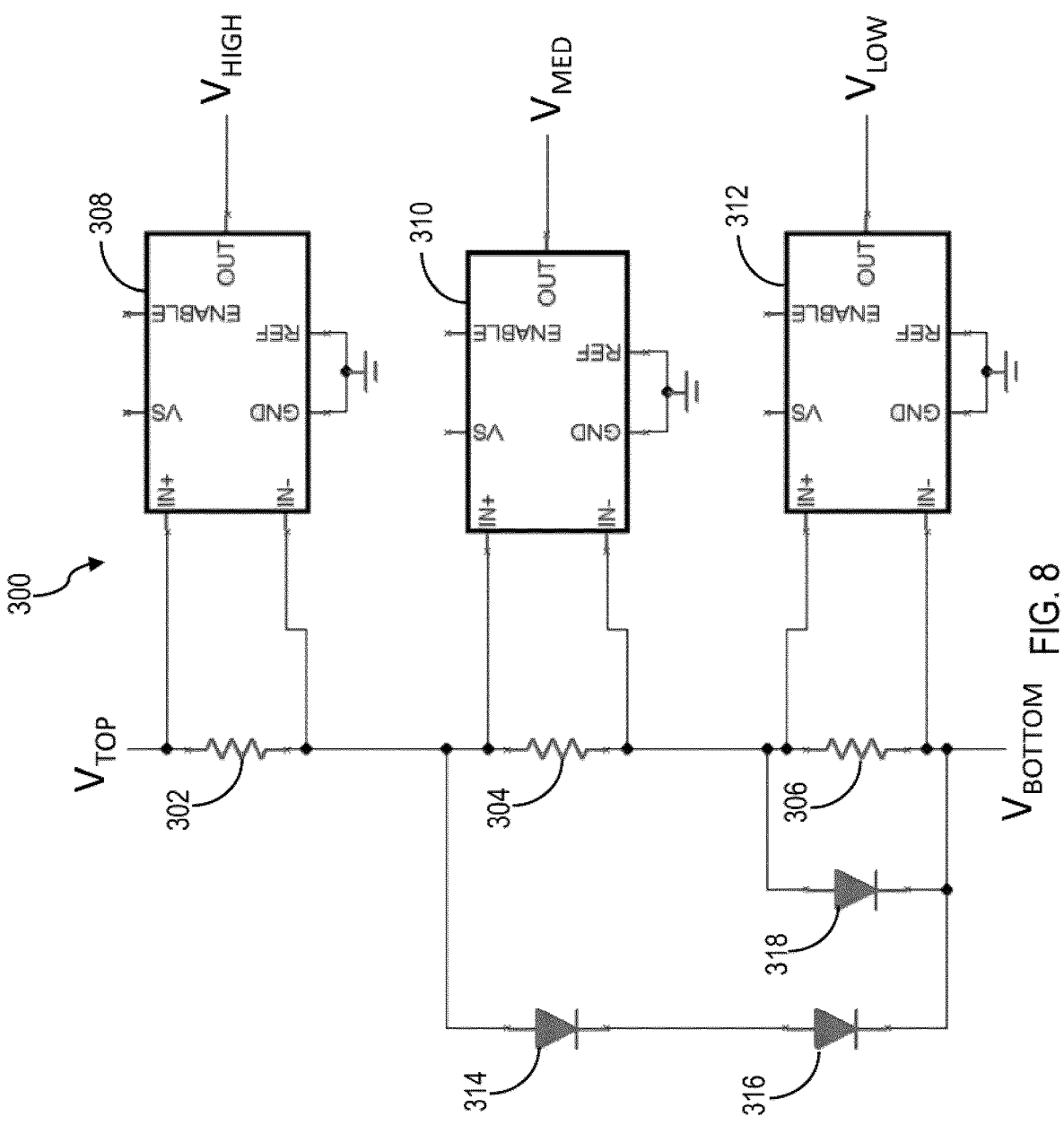
FIGS. 8-9 are diagrams of multi-stage current sense networks, according to various embodiments.

Referring to FIG. 8, shown therein is a diagram of a multi-stage current sense network 300, according to an embodiment. The current sense network 350 includes at least three current sense resistors 302, 304, 306, in series. The current sense network 350 includes OPAMPs 308, 310, 312 for measuring the voltages across the current sense resistors 302, 304, 306.

The value of the current sense resistor 306 is greater than the value of the current sense resistor 304; the value of the current sense resistor 304 is greater than the value of the current sense resistor 302. As such, the current sense resistor 306 is used to measure low current, the current sense resistor 304 is used to measure medium (intermediate) current, and the current sense resistor 302 is used to measure high current.

Diode voltage clamps 314, 316 provide a voltage clamp across the current sense resistors 304, 306, limiting the burden voltage across $V_{TOP}$ to $V_{BOTTOM}$. Similarly, a diode voltage clamp 318 provides a voltage clamp across the current sense resistor 306. As noted above, because the diode voltage clamps 314, 316, 318 limit the voltage drop across the current sense resistors 304, 306, the value of the current sense resistors 304, 305 can be independent of the maximum current flowing through the circuit incorporating the current sense network 300.

For a given range of current to be measured, the measurement will be split between the current sense resistors 302, 304, 306 in an overlapping manner as described above with reference to FIG. 4. For example, the maximum current for the current sense resistor 306 is set to a value 5 times the minimum resolution of the current sense resistor 304-OPAMP 310 measurement path; the maximum current for the current sense resistor 304 is set to a value 5 times the minimum resolution of the current sense resistor 302-OPAMP 308 measurement path.

Figure 9:
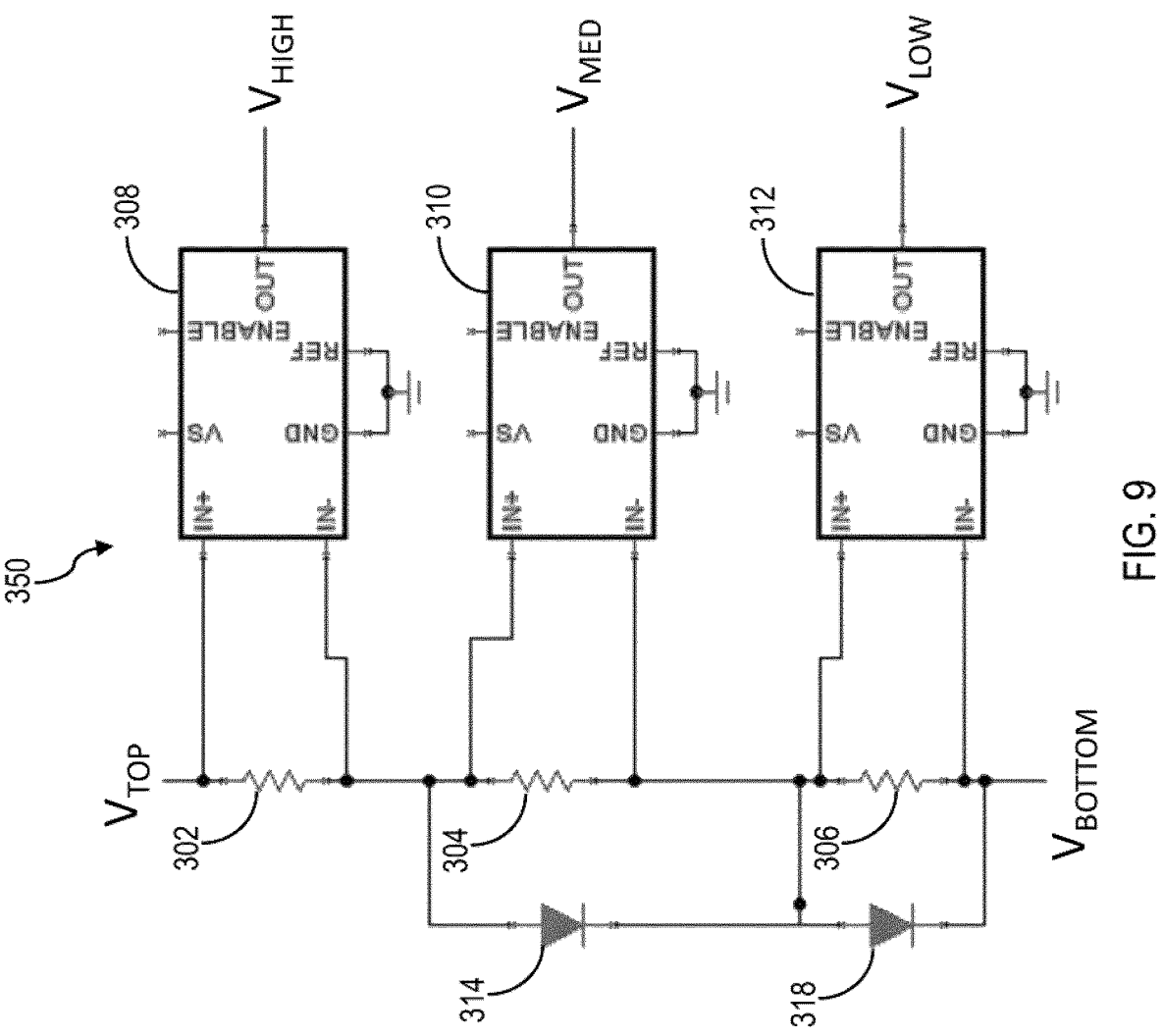

Referring to FIG. 9, shown therein is a diagram of a multi-stage current sense network 350, according to another embodiment. The multi-stage current network 350 is an alternative arrangement of the multi-stage current sense network 300 shown in FIG. 8, wherein the diode voltage clamp 314 is in parallel with the current sense resistor 304 and the diode voltage clamp 316 (see FIG. 8) is omitted.

Referring to FIGS. 8-9, an advantage of the current sense network 300 is effective heat dissipation. When a diode voltage clamp 314, 316, 318 heats up, its forward voltage drop changes (usually decreases) which in turn affects the parameters of the circuit. To minimize the change in voltage drop, when there is a high current, the diode voltage clamp 318 in the current sense network 300 (FIG. 8) is bypassed and does not conduct current and thus does not heat up changing its forward voltage. Whereas, in the current sense network 350 (FIG. 9) the diode voltage clamp 318 does conduct high current and will heat up changing its forward voltage drop. This is a consideration when selecting a particular current sense network 300, 350 design.

When designing the overall system/circuit incorporating a multi-stage current sense network 300, 350, there is an interplay between several factors including: (1) the number of current sense resistor 302, 304, 306 stages and current sense resistor values; (2) the OPAMP 308, 310, 312 gain and input referred noise; (3) ADC effective resolution at the desired sample rate and input voltage range without saturation; and (4) the diode clamp 314, 318 parameters such as the forward voltage drop characteristics. The interplay between (1)-(4) is roughly related to the dynamic range each stage can achieve (for a given signal-to-noise ratio, SNR) and the total current range to cover. It should be noted that factors (1)-(4) are not an exhaustive list of considerations.

The use of current sense stages allows for extending the dynamic range of the system/circuit, at the expense of system/circuit complexity. As an example, a comparison of a single stage current sensing network vs. a multi-stage current sensing network is described below, assuming it is desired to have a minimum SNR of 40 dB (approximately 1%) to cover current measurements from ±1 μA to ±1 A supporting input signals from 0 Hz to 20 KHz.

Figure 1A:
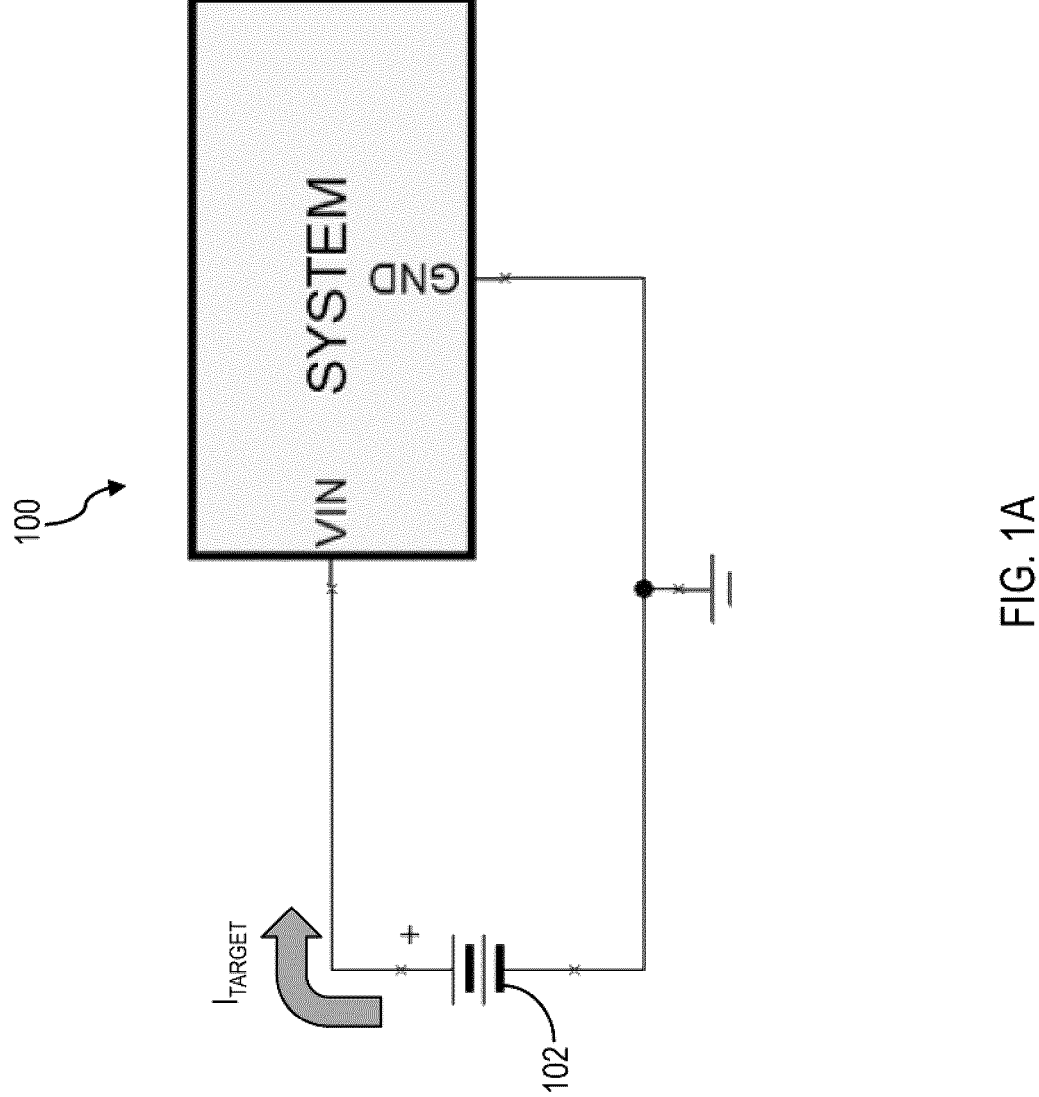
FIG. 1A is a diagram of a battery powered system.
Figure 1B:
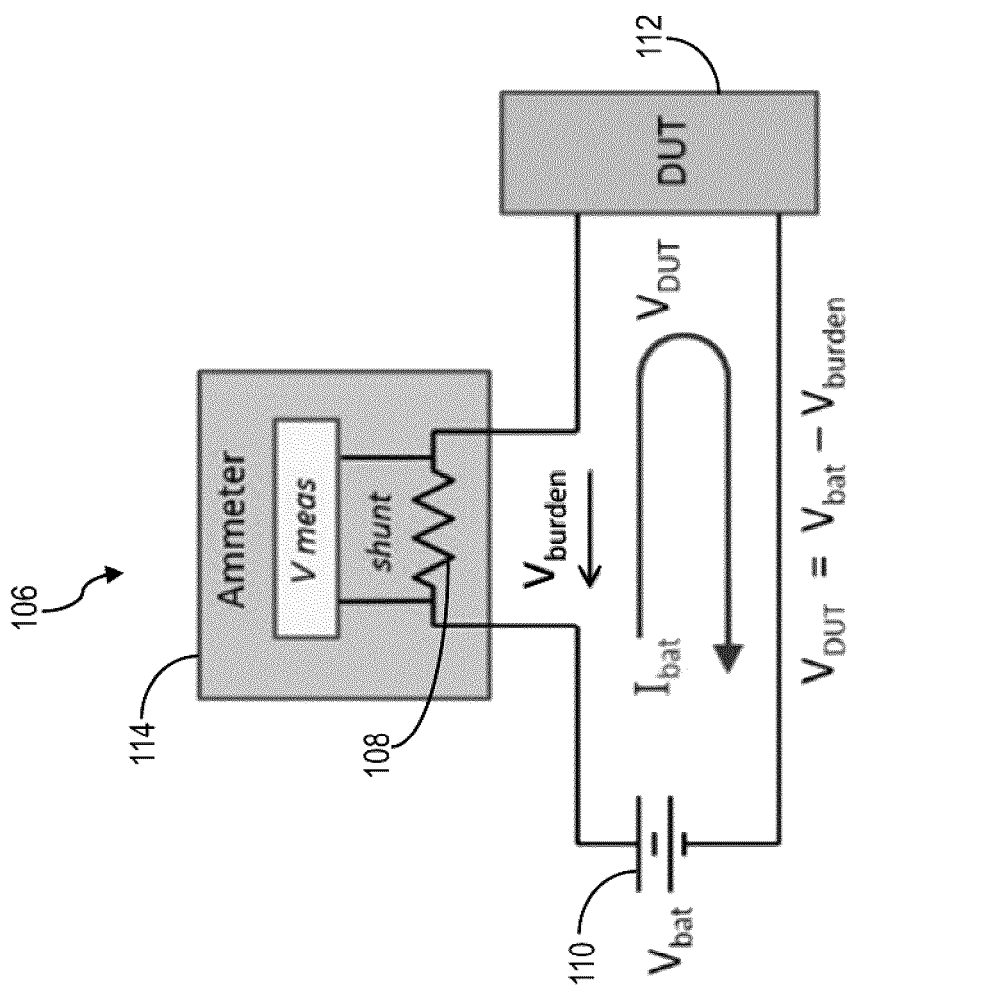
FIG. 1B is a diagram of a digital ammeter current measurement.
Figure 2A:
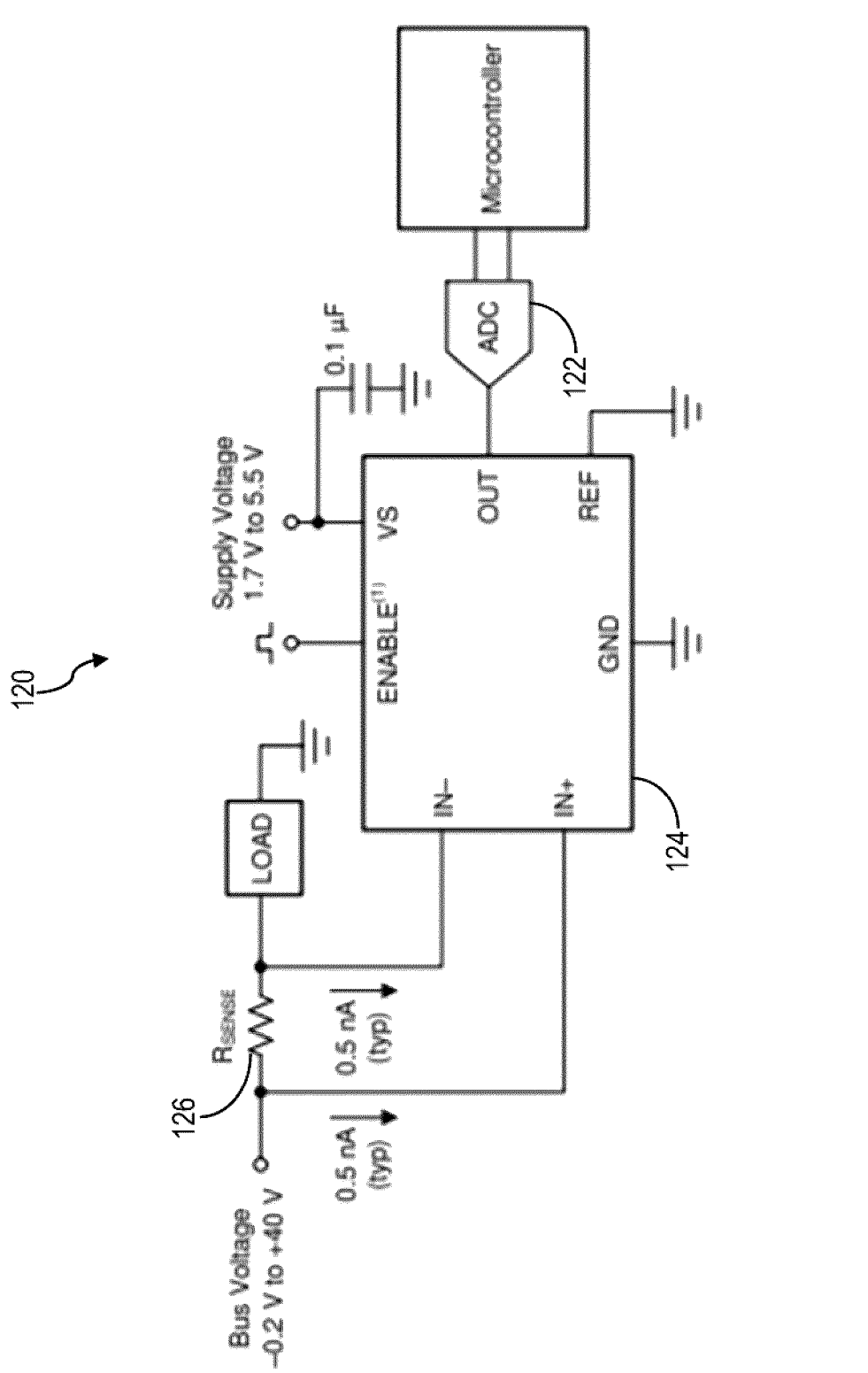
FIG. 2A is a diagram of a typical current sensing circuit using a differential operational amplifier.
Figure 2B:
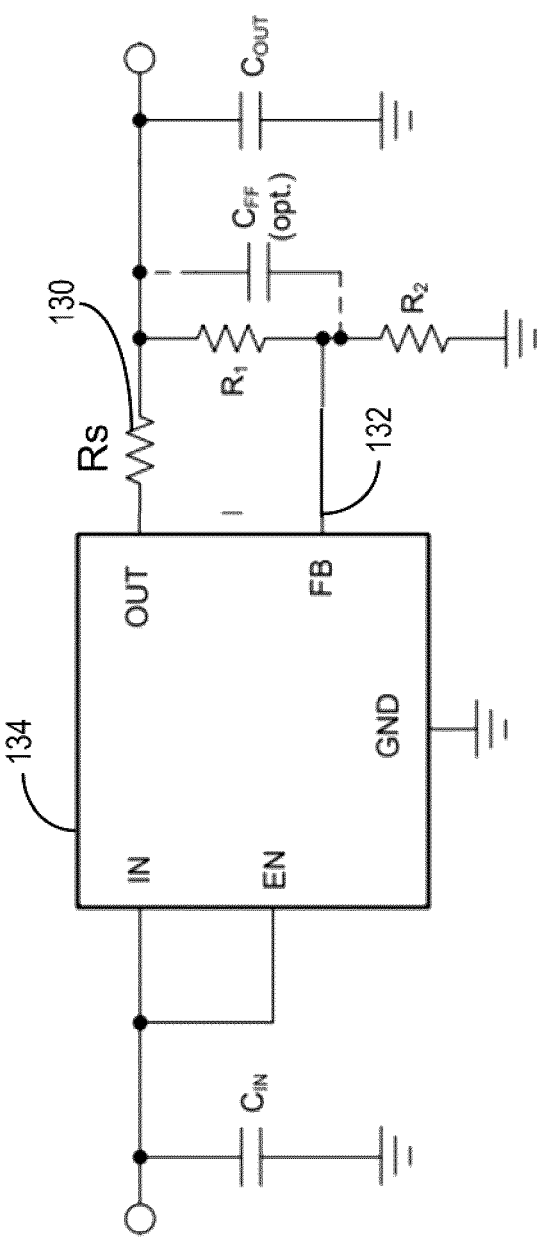
FIG. 2B is a diagram of a typical current sensing circuit using a linear regulator with a current sense resistor feedback loop.
Figure 2C:
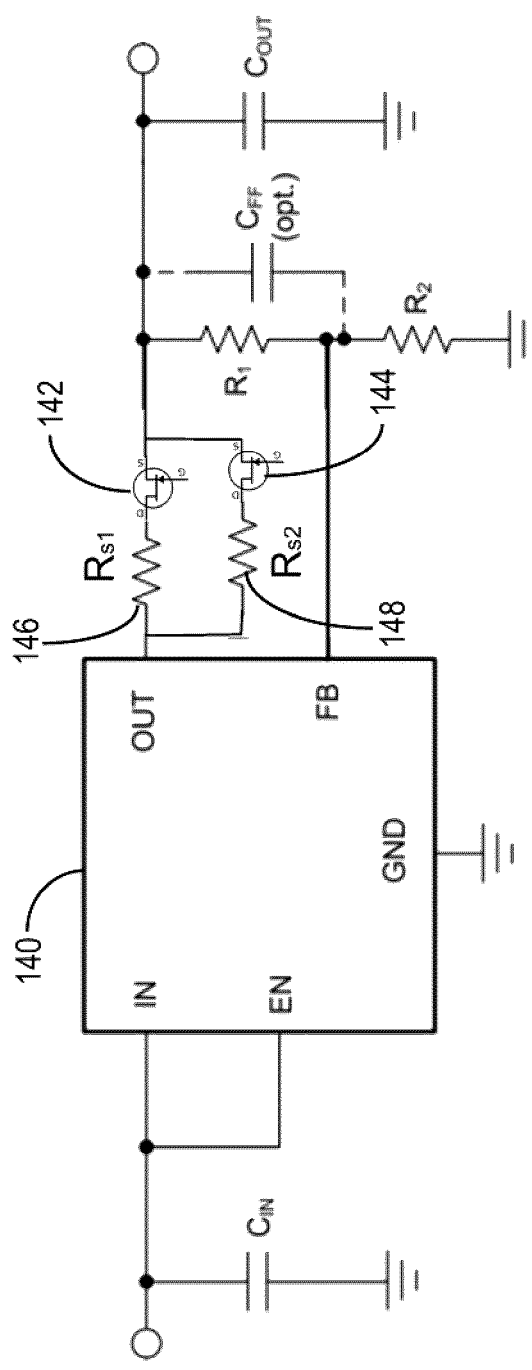
FIG. 2C is a diagram of a typical current sensing circuit using a linear regulator with switching FETs in a control loop.

A single stage solution (e.g., FIG. 2A), has an ADC 122 with an effective resolution of approximately 26.6 bits (log 2(1/1e−6*100)). The ADC 122 input range of +4V means input trans-impedance gain of 4 V/A to avoid saturation. With an input referred noise level of 10 nA (1 μA/(10^(40/20)=1 μA/100), this would mean that the ADC 122 would need to see an input referred noise level of 40 nV RMS integrated over the input bandwidth of 20 kHz. Generally, such an implementation is expensive and impractical with commercially available components.

In a multi-stage solution (e.g., FIGS. 8-9), assume the ADC has an input range (without saturation) of ±4 V, and an effective resolution of 16 bits. A first stage (e.g., the current sense resistor 306-OPAMP 312 measurement path) could use a trans-impedance gain of 4V/A to represent signals as large as 1 A (4V/4 V/A). This can then be used to represent signals down to approximately 3 mA, with 40 dB SNR (4 V/2^15*100/(4 V/A)=~3 mA). The first stage can use a 0.1 Ohm sense resistor 306 and an OPAMP 312 with a gain of 40 to achieve an overall input gain of 4 V/A (0.1 V/A*40 V/V). The input referred noise level of the OPAMP 312 would need to be less than 3 μV RMS integrated over the 0-20 kHz (3 mA/100*0.1 V/A=3 μV RMS).

A second stage (e.g., the current sense resistor 304-OPAMP 310 measurement path) could use a trans-impedance gain of 1000 V/A (4V/4 mA), slightly overlapping with the first stage, to represent signals as large as 4 mA (4 V/1000 V/A). This can then be used to represent signals down to approximately 12 μA with 40 dB SNR (4 V/2^15*100/(1000 V/A)=~12 μA. The second stage can use a 25 Ohm sense resistor 304 and an OPAMP 310 with a gain of 40 to achieve an overall input gain of 1000 V/A (25 V/A*40 V/V). The input referred noise level of the OPAMP 310 would need to be less than 3 μV RMS integrated over the 0-20 KHz (12 μA/100*25 V/A=3 μV RMS).

A third stage (e.g., the current sense resistor 302-OPAMP 308 measurement path) could use a trans-impedance gain of 20000 V/A (4 V/200 μA), overlapping with the second stage, to represent signals as large as 200 μA (4V/20000 V/A). This can then be used to represent signals down to approximately 0.6 μA with 40 dB SNR (4 V/2^15*100/(20000 V/A)=~0.6 μA). The third stage can use a 500 Ohm sense resistor 302 and an OPAMP 308 with a gain of 40 to achieve an overall input gain of 20000 V/A (500 V/A*40 V/V). The input referred noise level of the OPAMP 308 would need to be less than 3 μV RMS integrated over the 0-20 kHz (0.6 μA/100*500 V/A=3 μV RMS).

Accordingly, as can be seen from the above example, a large set of design implementations are available, by adjusting one or more of: the number of current sense stages; the sense resistor values; the ADC effective bits (typically dependent on sample rate, technology choices (SAR, delta-sigma), price, power consumption); the input referred noise level of OPAMPs (typically dependent on level of integration (monolithic, desecrate, etc.), price, power consumption; and the desired SNR and overall dynamic range. Physical constraints due to thermal noise within the various components (i.e., the resistors, transistors, etc.) is also taken into consideration.

Figure 10:
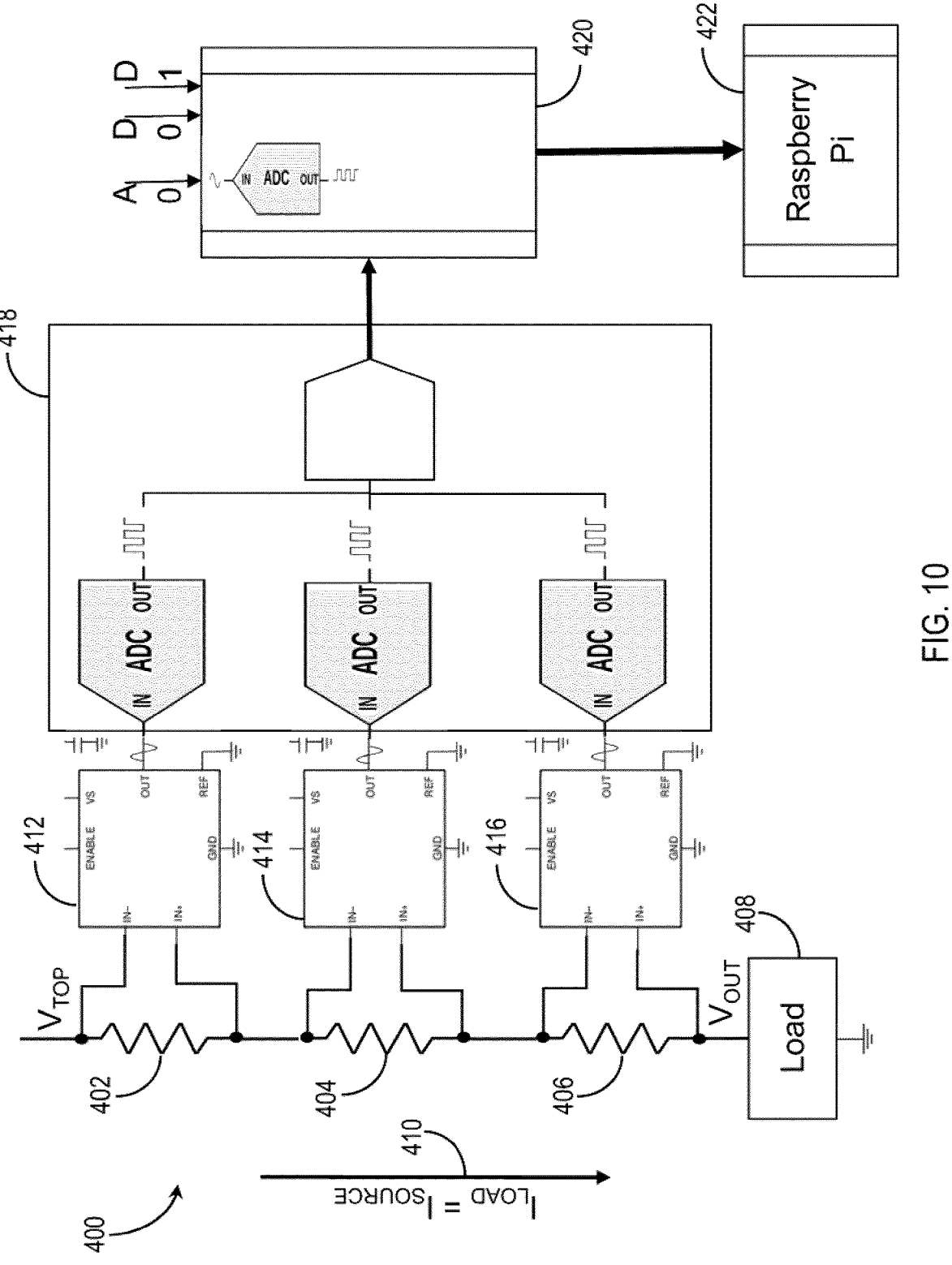
FIG. 10 is a diagram of a multi-stage current sense circuit, according to an embodiment.

Referring to FIG. 10, shown therein is a simplified diagram of a multi-stage current sense circuit 400, according to an embodiment. The current sense circuit 400 includes three current sense resistors 402, 404, 406, in series. For simplicity and ease of illustration, the voltage clamping diodes on the resistors 404, 406 are not shown. The current sense circuit 400 include a load 208. The load 208 may be an internal or external load. It should be noted that the source current to the circuit 400 ($I_{SOURCE}$) is equal to the load current ($I_{LOAD}$). The direction of the current is from $V_{TOP}$ to $V_{OUT}$, as shown by arrow 410.

The current sense circuit 400 includes OPAMPs 412, 414, 416 for measuring the voltages across the current sense resistors 402, 404, 406. The current sense circuit 400 includes a simultaneously multi-channel ADC 418, which samples the $I_{SOURCE}$ current across the current sense resistors 402, 404, 406. The multi-channel ADC 418 may be the ADS1174 from Texas Instruments. The data output from the multi-channel ADC 418 is pipelined via a microcontroller 420 to a single-board computer (e.g., a Raspberry Pi) 422 configured for analyzing the current across the sense resistors 402, 404, 406. For example, the computer 422 may implement an algorithm to analyze the current across the sense resistors 402, 404, 406 to adjust the current consumption state of a load device under test (not shown) connected to the circuit 400, based on the current across the resistors, 402, 404, 406, to conserve battery life/energy consumption.

Figure 11:
FIG. 11 is a diagram of overlapping current sense resistor measurement ranges, according to an embodiment.

Referring to FIG. 11, shown therein is a diagram 450 of overlapping current sense resistor measurement ranges, according to an embodiment. The horizontal axis shows three current sense resistors ($R_{S1}$, $R_{S2}$, $R_{S3}$) in a multi-stage current sense network. The vertical axis shows the source current ($I_{SOURCE}$) divided into measurement ranges of high ($I_{HIGH}$), medium ($I_{MED}$) and low ($I_{LOW}$) current. Below, the calculations to describe the current measurement ranges are explained.

From Ohm's Law, the voltage across each current sense resistor $R_{S1}$, $R_{S2}$, $R_{S3}$ is calculated as: $V_{RS\ \#}=I_{SOURCE}*R_{RS\ \#}$, where # is 1, 2 or 3 per the diagram 450.

Assuming a gain, A, of 25 applied by an OPAPM connected to each current sense resistor $R_{S1}$, $R_{S2}$, $R_{S3}$, the voltage output by the OPAPM (the difference of its inputs) is calculated as: $V_{AMP\ \#}=A*(IN+-IN-)=V_{RS\ \#}$, thus $V_{AMP\ \#}=25*I_{SOURCE}*R_{RS\ \#}$, where # is 1, 2 or 3 per the diagram 450.

An ADC then converts $V_{AMP\ \#}$ into a digital value ($ADC_{VAL\ \#}$) calculated as: $ADC_{VAL\ \#}=INT(V_{AMP\ \#}/2.5*2^{15}-1)$, wherein INT( ) is a 16-bit integer and $2^{15}-1==0x7FFF$ which is the single ended full scale value. Substituting for $V_{AMP\ \#}$ gives a "master equation" for the upper limit of the measurement range of each current sense resistor: $ADC_{VAL\ \#}=INT((25*I_{SOURCE}*R_{RS\ \#})/2.5*(2^{15}-1))$, where # is 1, 2 or 3 per the diagram 450.

It should be noted the $R_{RS\ \#\ values}$ are known values. For example, $R_{RS3}=130.0$ Ohms (measures lowest current range, $I_{LOW}$); $R_{RS2}=0.685$ Ohms (measures medium current range, $I_{MED}$); and $R_{RS1}=0.060$ Ohms (measures highest current range, $I_{HIGH}$). It should be noted that $I_{SOURCE}$ is the same for all ADC channels, and $R_{LOAD}$ is the load resistance ($I_{SOURCE}=V_{OUT}/R_{LOAD}$).

From the above calculations, it should be further noted that when $V_{AMP\ \#}>2.5$ V, the $ADC_{VAL\ \#}=0x7FFF$ and is invalid. In other words, the $I_{SOURCE}$ is too high for that channel/measurement path. For any given $I_{SOURCE}$, the "accepted" value for the current will come from the highest RS # channel.

Figure 12:
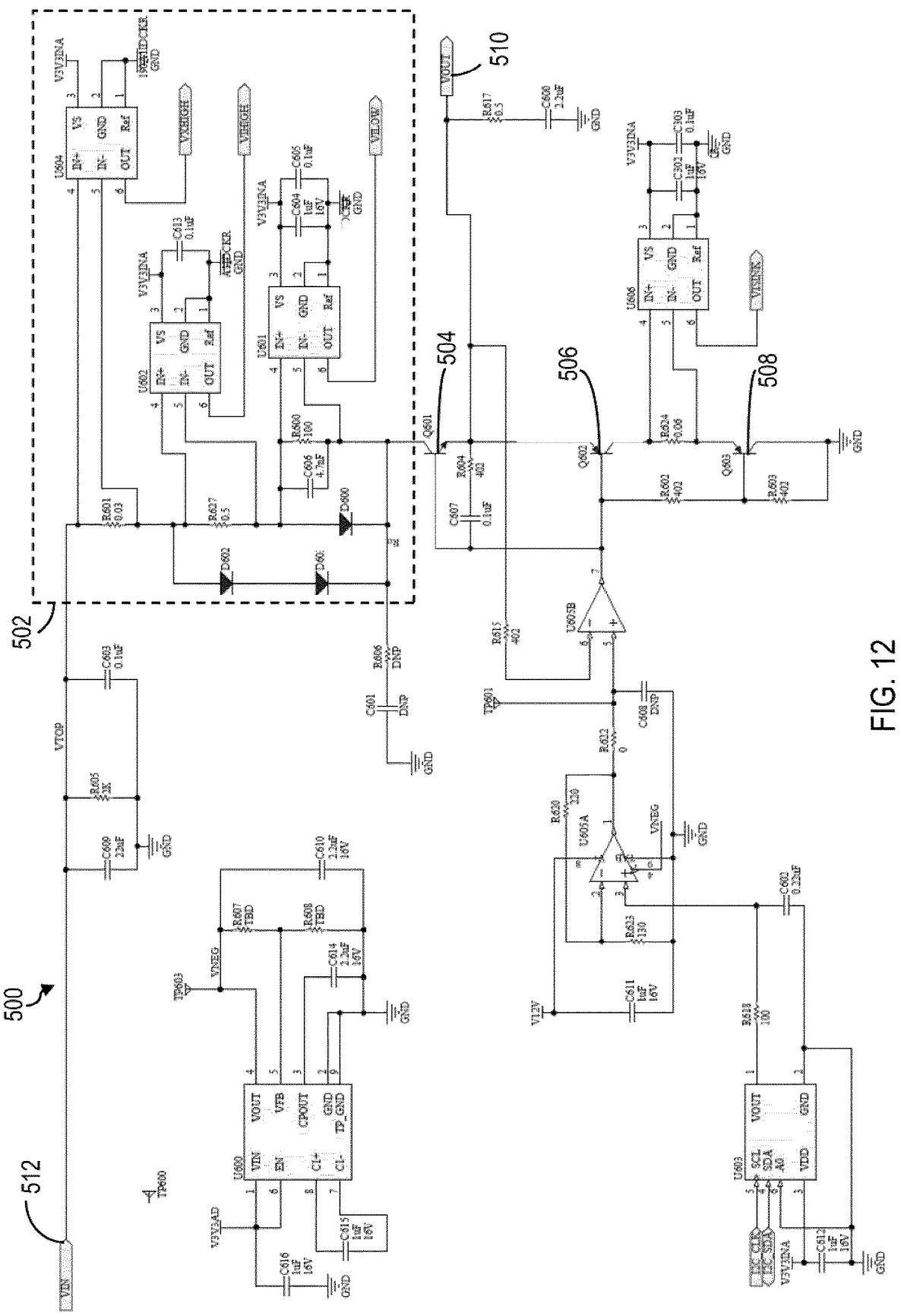
FIG. 12 is a diagram of a current sense network implemented in a power supply.

Referring to FIG. 12, shown therein is a diagram of a current sense network 502 implemented in a power supply 500, according to an embodiment. The current sense network 502 may be the current sense network 350 shown in FIG. 9. The current sense network 502 is connected to a input voltage pin 512 of the power supply 500.

The power supply 500 is an emitter-follower type power supply comprising comprises a plurality of bipolar transistors 504, 506, 508, where a user can select the output voltage 510, and the power supply 500 circuit creates the selected voltage by switching via the transistors 504, 506, 508. The power supply 500 can sync current for battery powered devices. According to other embodiments, the power supply 500 may be of a different type (e.g., non-syncing, or of a different type than emitter-follower).

Figure 13:
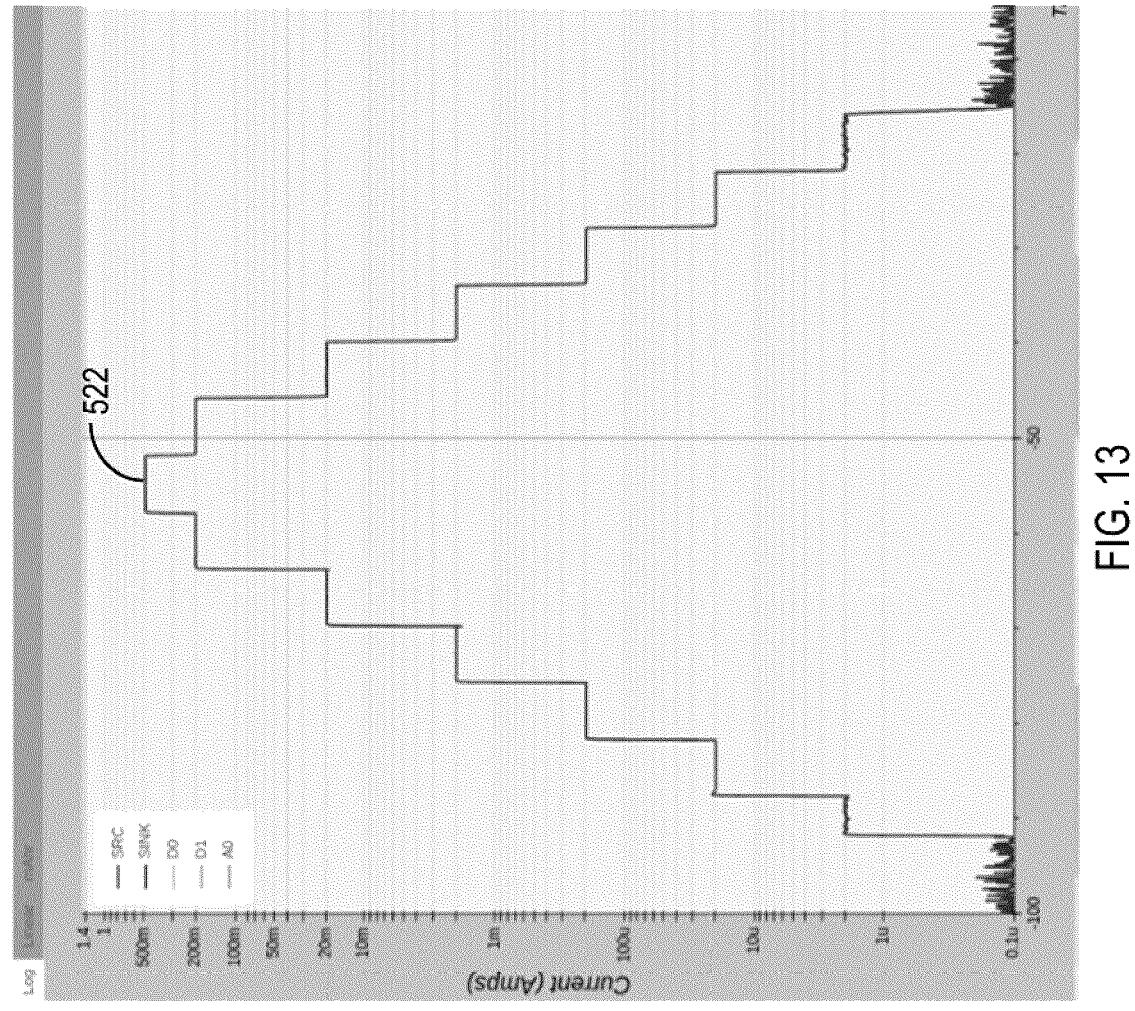
FIG. 13 is an exemplary plot of a test current profile across a wide dynamic range in the power supply of FIG. 12.
Figure 13:
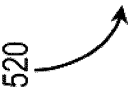

Referring to FIG. 13, shown therein is an exemplary plot 520 of a test current profile 522 across a wide dynamic range in the power supply 500 shown in FIG. 12. The vertical axis is on a log scale showing the change in current as a load is switched through current sense resistors of "none", 2M Ohms, 200K Ohms, 20K Ohms, 2K Ohms, 200 Ohms, 20 Ohms and 8.06 Ohms, with an output voltage of 4.0 V. The step-wise current profile 522 indicates, the current through the power supply 500 is stably measurable over a wide dynamic range from, at least, micro-Amps to Amps. Generally, the current sense networks described herein can measure 0.1 μA up to ~3.2 Amps (6-7 orders of magnitude) at a sampling rate of 10 KHz. This is typically sufficient for current measurements of IoT battery powered device components ranging from microcontrollers (micro-Amp current consumption) to radio modems (1-2 Amp current consumption). By sampling at a higher frequency and averaging current measurement, it may be possible to resolve an even wider dynamic range of current measurements.

In implementing the current sense networks and circuits described herein, a degree of calibration familiar to those skilled in the art is desired to remove "offsets" within the circuit signal path. Specifically, there is often a small quiescent current flowing through the power supply under "no load" condition. This "no load" current is measured and subtracted from the result on each measurement path, "zeroing" the baseline measurement. There are also offsets in the OPAMP and ADC signal path that need to be subtracted. These offsets likely vary with the power supply output voltage, therefore the calibration is done at all supported output voltages.

The circuit architectures described herein are also tolerant to temperature changes, either from ambient temperature or from heat created by the power in the circuit, since the current sense resistors can be selected to have a low temperature coefficient. Whereas an active switching sense element would be more vulnerable to temperature changes and have a complex calibration process to remove such dependency. A further benefit offered by the present circuit architectures is sampling at a relatively high rate for real-time current measurements without introducing artefacts.

While the above description provides examples of one or more circuits, methods, or systems, it will be appreciated that other circuits, methods, or systems may be within the scope of the claims as interpreted by one of skill in the art.

The invention claimed is:

1. A current sense circuit, comprising:
a current sense network, comprising:
a first current sense resistor having a first value;
at least a second current sense resistor having a second value greater than the first value and connected in series to the first current sense resistor,
wherein the first value and the second value are selected to maximize voltage for a given range of current flowing through the current sense resistors; and
a first diode voltage clamp connected in parallel with the at least second current sense resistor, to limit burden voltage across the at least second current sense resistor for the given range of current, thereby limiting a total voltage drop across the current sense network; and
a closed loop regulated voltage supply connected to the at least second current sense resistor, for regulating voltage from a power source to a load,
wherein the current sense resistors are positioned ahead of the closed loop regulated voltage supply in a direction of current flow through the current sense circuit.

2. The current sense circuit of claim 1, wherein the total voltage drop of the current sense network is limited to a maximum voltage drop sufficient for the closed loop regulated voltage supply to supply a desired voltage to the load.

3. The current sense circuit of claim 1, wherein the power source is a battery.

4. The current sense circuit of claim 1, wherein the given range of current covers at least, a 0.1 micro-Amp to 3.2 Amp range.

5. The current sense circuit of claim 1, wherein the closed loop regulated voltage supply is a monolithic linear regulator.

6. The current sense circuit of claim 1, wherein the current sense network further comprises:

at least a third current sense resistor having a third value greater than the second value and connected in series to the second current sense resistor; and at least a second diode voltage clamp connected in parallel with the at least third current sense resistor, to limit burden voltage across the at least third current sense resistor, thereby limiting the total voltage drop of the current sense network.

7. The current sense circuit of claim 1, further comprising:

a first fixed gain differential amplifier for amplifying a first voltage drop across the first current sense resistor into a first output voltage suitable for a current measurement by an analog to digital converter; and at least a second fixed gain differential amplifier for amplifying a second voltage drop across the at least second current sense resistor into a second output voltage suitable for the current measurement by the analog to digital converter.

8. The current sense circuit of claim 7, wherein the digital to analog converter is a multi-channel converter configured to simultaneously measure the first output voltage and the second output voltage to sample the current measurement across the current sense resistors.

9. The current sense circuit of claim 7, wherein the first fixed gain differential amplifier and the first current sense resistor form a first measurement path for high input voltage corresponding to a low current range within the given range of current; and wherein the second fixed gain differential amplifier and the at least second sense resistor form at least a second measurement path for low input voltage corresponding to a high current range within the given range of current.

10. The current sense circuit of claim 7, further comprising:

a controller configured to:

analyze the current measurement from the analog to digital converter; and adjust a current consumption state of the load based on the current across the current sense resistors.

11. The current sense circuit of claim 9, wherein an upper limit of the low current range overlaps with a lower limit of the high current range.

12. The current sense circuit of claim 9, wherein an upper limit of the high input voltage is at least five times an upper limit of the low input voltage.

13. The current sense circuit of claim 1, further comprising a current mirror for mirroring a current to the load and directing the current into the current sense network.

14. The current sense circuit of claim 13, wherein the current mirror is one of: a PNP current mirror, a cascade current mirror and a Wildar current mirror.

15. A current sense network, comprising:

a first current sense resistor having a first value;

at least a second current sense resistor having a second value greater than the first value and connected in series to the first current sense resistor, wherein the first value and the second value are selected to maximize voltage for a given range of current flowing through the current sense resistors;

a first diode voltage clamp connected in parallel with the at least second current sense resistor, to limit burden voltage across the at least second current sense resistor for the given range of current, thereby limiting a total voltage drop across the current sense network;

a first fixed gain differential amplifier for amplifying a first voltage drop across the first current sense resistor into a first output voltage suitable for a current measurement by an analog to digital converter; and at least a second fixed gain differential amplifier for amplifying a second voltage drop across the at least second current sense resistor into a second output voltage suitable for the current measurement by the analog to digital converter, wherein the current sense network is integrated into a closed loop power supply circuit.

16. The current sense network of claim 15, further comprising:

at least a third current sense resistor having a third value greater than the second value and connected in series to the second current sense resistor;

at least a second diode voltage clamp connected in parallel with the at least third current sense resistor, to limit burden voltage across the at least third current sense resistor, thereby limiting the total voltage drop of the current sense network; and at least a third fixed gain differential amplifier for amplifying a third voltage drop across the at least third current sense resistor into a third output voltage suitable for the current measurement by the analog to digital converter.

17. The current sense network of claim 16, wherein the digital to analog converter is a multi-channel converter configured to simultaneously measure the first output voltage the second output voltage and the third output voltage to sample the current measurement across the current sense resistors.

18. The current sense network of claim 16, wherein the first fixed gain differential amplifier and the first current sense resistor form a first measurement path for high input voltage corresponding to a low current range within the given range of current;

wherein the second fixed gain differential amplifier and the at least second sense resistor form a second measurement path for low input voltage corresponding to a high current range within the given range of current; and wherein the third fixed gain differential amplifier and the at least third sense resistor form at least a third measurement path for intermediate input voltage corresponding to an intermediate current range within the given range of current.

19. The current sense network of claim 18, wherein an upper limit of the low current range overlaps with a lower limit of the intermediate current range; and wherein an upper limit of the intermediate current range overlaps with a lower limit of the high current range.

20. The current sense network of claim 18, wherein an upper limit of the high input voltage is at least five times an upper limit of the intermediate input voltage; and wherein the upper limit of the intermediate input voltage is at least five times an upper limit of the low input voltage.

* * * * *